(12) United States Patent
Okumura et al.

(10) Patent No.: US 12,021,361 B2
(45) Date of Patent: Jun. 25, 2024

(54) ELECTRICAL CONNECTION BOX COVER AND ELECTRICAL CONNECTION APPARATUS

(71) Applicant: Sumitomo Wiring Systems, Ltd., Yokkaichi (JP)

(72) Inventors: Masakazu Okumura, Yokkaichi (JP); Akihiro Oda, Yokkaichi (JP); Tatsuya Daidoji, Yokkaichi (JP); Noriko Okamoto, Yokkaichi (JP); Ryoma Hamada, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 280 days.

(21) Appl. No.: 17/597,812

(22) PCT Filed: Jul. 22, 2020

(86) PCT No.: PCT/JP2020/028363
§ 371 (c)(1),
(2) Date: Jan. 25, 2022

(87) PCT Pub. No.: WO2021/020254
PCT Pub. Date: Feb. 4, 2021

(65) Prior Publication Data
US 2022/0255302 A1 Aug. 11, 2022

(30) Foreign Application Priority Data

Jul. 30, 2019 (JP) .............................. JP2019-140104

(51) Int. Cl.
*H02G 3/08* (2006.01)
*H02G 3/14* (2006.01)
*H02G 3/16* (2006.01)

(52) U.S. Cl.
CPC ............... *H02G 3/083* (2013.01); *H02G 3/14* (2013.01); *H02G 3/16* (2013.01)

(58) Field of Classification Search
CPC .. H02G 3/14; H02G 3/16; H02G 3/08; H02G 3/081; H02G 3/083; B60R 16/02;
(Continued)

(56) References Cited

U.S. PATENT DOCUMENTS 7,878,357 B2 * 2/2011 Yoshida ................. H02G 3/081
174/67
8,587,931 B2 * 11/2013 Shiraiwa .............. H05K 1/0263
361/752
(Continued)

FOREIGN PATENT DOCUMENTS

| JP | 2501429 Y2 | 6/1996 |
|---|---|---|
| JP | 2002-186149 A | 6/2002 |
| JP | 2017-060283 A | 3/2017 |

OTHER PUBLICATIONS

International Search Report, Application No. PCT/JP2020/028363, mailed Oct. 20, 2020. ISA/Japan Patent Office.

*Primary Examiner* — Angel R Estrada
(74) *Attorney, Agent, or Firm* — Honigman LLP

(57) ABSTRACT

Provided is an electrical connection box cover for covering a plurality of insertion ports for fuses of an insertion housing in which a plurality of rows of the insertion ports arranged side by side in one direction are provided in a stepped shape, the electrical connection box cover including a flat opposing wall that opposes the insertion ports when the electrical connection box cover is attached to the electrical connection box.

4 Claims, 5 Drawing Sheets

(58) Field of Classification Search
CPC ........ B60R 16/00; H01H 9/02; H01H 9/0242;
H01H 9/0264; H01H 9/20; H01H 9/22;
H05K 5/03; H05K 5/00; H05K 5/0091
USPC .......... 174/50, 520, 17 R, 66, 67, 542, 535;
220/3.2–3.9, 4.02, 241, 242; 439/76.1,
439/76.2, 949; 312/223.1, 223.6;
361/600, 601, 622, 241
See application file for complete search history.

(56) References Cited

U.S. PATENT DOCUMENTS

| | | | | |
|---|---|---|---|---|
| 8,907,213 | B2* | 12/2014 | I | B60R 16/0238 |
| | | | | 174/562 |
| 8,941,009 | B2* | 1/2015 | Makino | B60R 16/0238 |
| | | | | 174/59 |
| 8,969,723 | B2* | 3/2015 | Hirasawa | H02G 3/088 |
| | | | | 439/76.1 |
| 9,172,218 | B2* | 10/2015 | Kamigaichi | H02G 3/081 |
| 9,190,818 | B2* | 11/2015 | Shiraki | H02G 3/081 |
| 9,468,121 | B2* | 10/2016 | Yamaguchi | H05K 7/02 |
| 11,377,051 | B2* | 7/2022 | Kurata | H02G 3/14 |
| 11,855,429 | B2* | 12/2023 | Magda | H02G 3/081 |
| 2005/0020106 | A1 | 1/2005 | Ito | |
| 2009/0163053 | A1 | 6/2009 | Yamaguchi et al. | |
| 2014/0134886 | A1 | 5/2014 | Makino et al. | |

* cited by examiner

ELECTRICAL CONNECTION BOX COVER AND ELECTRICAL CONNECTION APPARATUS

CROSS-REFERENCE TO RELATED APPLICATIONS

This application is the U.S. national stage of PCT/JP2020/028363 filed on Jul. 22, 2020, which claims priority of Japanese Patent Application No. JP 2019-140104 filed on Jul. 30, 2019, the contents of which are incorporated herein.

TECHNICAL FIELD

The present disclosure relates to an electrical connection box cover and an electrical connection apparatus.

BACKGROUND

Conventionally, an electrical connection box into which a fuse is inserted has been installed in a vehicle.

JP 2014-99947A discloses an electrical connection means in which rows of fuse insertion ports arranged side by side in one direction are provided on a substrate in a stepped shape with four levels, and two rows of insertion ports located far from the substrate are provided toward the center of the substrate relative to the other two rows of insertion ports.

On the other hand, in the electrical connection box, it is necessary to cover the insertion ports into which the fuses are inserted with a cover from the viewpoint of the appearance, safety, and the like. However, in an electrical connection box in which a plurality of rows of insertion ports are arranged in a stepped shape as described above, if a cover having a shape that follows the arrangement shape of the rows of insertion ports is used, there is a problem in that laser machining of the outer surface of the cover is not easy, a passenger's clothes will be caught on the recesses and protrusions of the cover, and the like.

However, with the above-mentioned electrical connection means, no cover has been devised at all, and such a problem cannot be solved.

In view of this, an object is to provide an electrical connection apparatus and an electrical connection box cover, which is a cover to be used in an electrical connection box in which a plurality of rows of insertion ports are arranged in a stepped shape, the electrical connection box cover being such that laser-machining of the outer surface is easy, and a passenger's clothes will not catch thereon.

Advantageous Effects of Present Disclosure

According to an aspect of the present disclosure, it is possible to provide an electrical connection box cover for which laser-machining of the outer surface is easy, and on which a passenger's clothes will not catch, and an electrical connection apparatus.

SUMMARY

An electrical connection box cover according to an aspect of the present disclosure is an electrical connection box cover for covering a plurality of insertion ports for fuses of an electrical connection box including an insertion housing in which a plurality of rows of the plurality of insertion ports arranged side by side in one direction are provided in a stepped shape, the electrical connection box cover including a flat opposing wall configured to oppose the insertion ports when the electrical connection box cover is attached to the electrical connection box.

An electrical connection apparatus according to an aspect of the present disclosure includes the above-described electrical connection box cover and the electrical connection box.

DETAILED DESCRIPTION OF PREFERRED EMBODIMENTS

Figure 1:
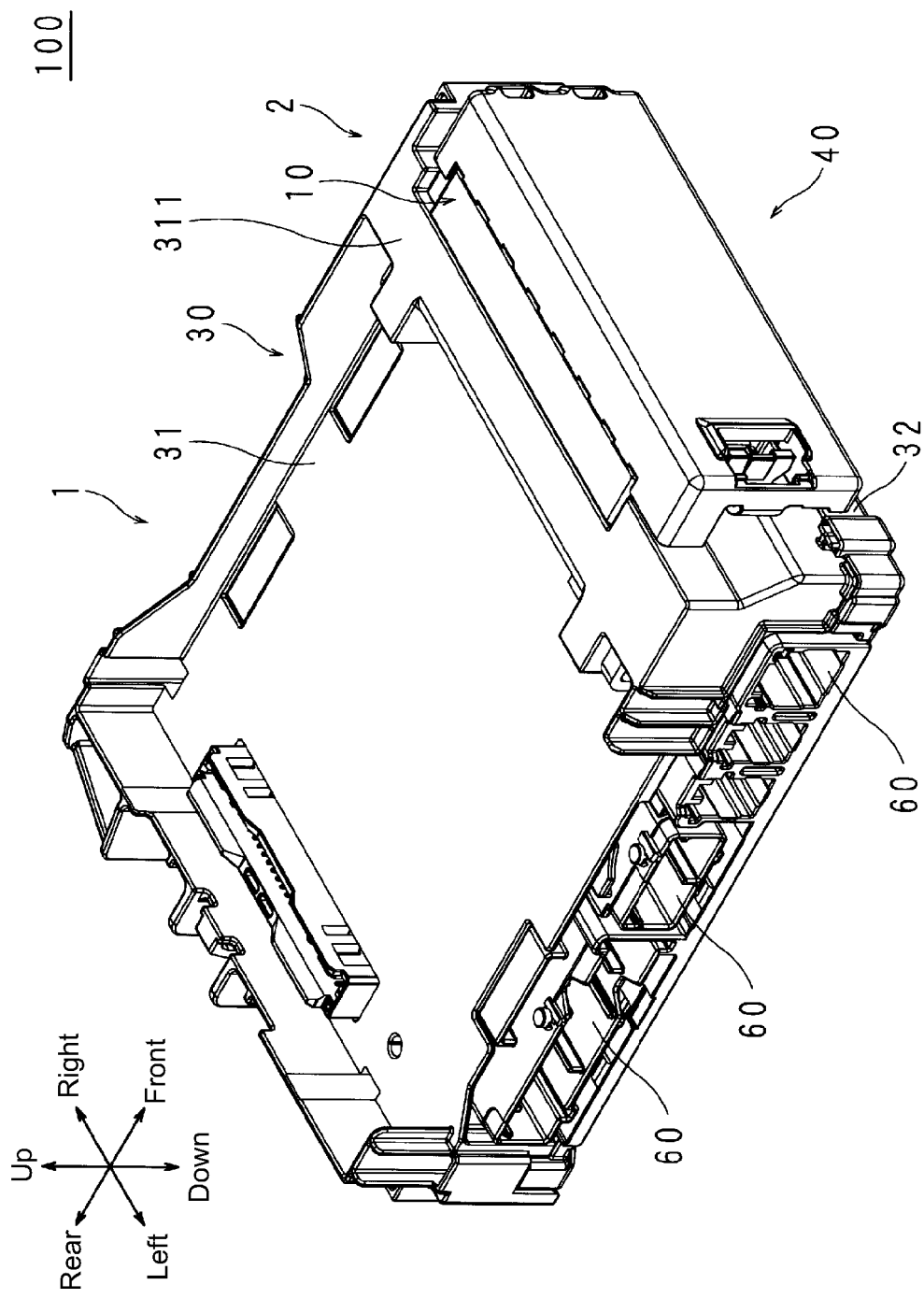
FIG. 1 is a perspective view showing the appearance of an electrical connection apparatus according to the present embodiment.

First, embodiments of the present disclosure will be listed and described. Also, at least some of the embodiments described below may be combined as appropriate.

An electrical connection box cover according to one aspect of the present disclosure is an electrical connection box cover for covering a plurality of insertion ports for fuses of an electrical connection box including an insertion housing in which a plurality of rows of the plurality of insertion ports arranged side by side in one direction are provided in a stepped shape, the electrical connection box cover including a flat opposing wall configured to oppose the insertion ports when the electrical connection box cover is attached to the electrical connection box.

In the present aspect, in the electrical connection box cover that covers the insertion housing of the electrical connection box, an opposing wall opposing the insertion ports is flat, even though the insertion ports of the insertion housing are provided in a stepped shape. Accordingly, laser-machining of the outer surface of the electrical connection box cover is easy, and a passenger's clothes can be prevented from catching thereon.

The electrical connection box cover according to an aspect of the present disclosure includes a spacer that is provided in a protruding manner on a surface of the opposing wall that opposes the insertion ports, a leading end of the spacer being configured to come into contact with the insertion housing when the electrical connection box cover is attached to the electrical connection box.

In this aspect, when the electrical connection box cover is attached to the electrical connection box, the leading ends of the spacers come into contact with the insertion housing. Accordingly, the interval between the electrical connection box cover (opposing wall) and the insertion housing can be maintained, and the electrical connection box cover appropriately covers the insertion ports of the insertion housing.

With the electrical connection box cover according to one aspect of the present disclosure, there is a plurality of the spacers, and the plurality of spacers are arranged side by side at a predetermined interval, and the electrical connection box cover includes a drainage port that is formed in the opposing wall and is configured to discharge a liquid flowing between the spacers.

In this aspect, a plurality of the spacers are arranged side by side at a predetermined interval, and the drainage port is formed on the opposing wall. Accordingly, since the liquid to be discharged flows between the spacers, the spacers cannot impede the flow of the liquid and the liquid is quickly discharged via the drainage port.

With the electrical connection box cover according to one aspect of the present disclosure, the opposing wall is rectangular, long-side walls that extend in a direction intersecting the opposing wall are respectively extending on both long-side edges of the opposing wall, and a rib that extends along an extension direction is provided on an inner surface of one of the two long-side walls with a longer dimension in the extension direction.

In this aspect, the rib extending along the extension direction is provided on the inner surface of the one long-side wall with a longer dimension in the extension direction among the two long-side walls extending in the direction intersecting with the opposing wall. Accordingly, although the dimension in the extension direction is long, it is possible to prevent the one long-side wall from bending.

With the electrical connection box cover according to an aspect of the present disclosure, a notch configured to engage with one side wall of the insertion housing is formed in the one long-side wall, and during the engagement, the one long-side wall and the one side wall are flush with each other.

In this aspect, if the electrical connection box cover is attached to the electrical connection box, the one side wall of the insertion housing engages with the notch formed in the one long-side wall, and at this time, the one long-side wall and the one side wall are flush with each other. That is, when the electrical connection box cover is attached to the electrical connection box, the one side wall of the insertion housing is located in the notch of the one long-side wall, and the one long-side wall and the one side wall of the insertion housing do not overlap with each other. Accordingly, the electrical connection box cover can be made compact.

The electrical connection apparatus according to the embodiment of the present disclosure includes any one of the above-described electrical connection box covers and the electrical connection box.

In this aspect, the insertion ports of the electrical connection box are covered with any one of the above-mentioned electrical connection box covers. Since the opposing wall of the electrical connection box cover is flat, laser-machining of the outer surface of the electrical connection box cover is easy, and a passenger's clothes can be prevented from catching thereon.

The present invention will be specifically described with reference to drawings showing an embodiment thereof. The electrical connection box cover and the electrical connection apparatus according to an embodiment of the present disclosure will be described below with reference to the drawings. Note that the present invention is not limited to these examples, but is indicated by the claims, and all modifications within the meaning and scope of equivalency to the claims are intended to be encompassed therein.

FIG. 1 is a perspective view showing the outer appearance of an electrical connection apparatus 100 according to the present embodiment. The electrical connection apparatus 100 is a so-called fuse box into which fuses are inserted, and is mounted in a vehicle.

The electrical connection apparatus 100 includes an electrical connection box 1 having a case member 30 for accommodating a substrate (not shown) on which circuit elements and the like are mounted and a fuse module 2 into which fuses are inserted, and a lid member 40 (electrical connection box cover) covering later-described insertion ports 12 through which fuses are inserted in the fuse module 2.

In the present embodiment, for the sake of convenience, the "front", "rear", "left", "right", "up", and "down" of the electrical connection apparatus 100 are defined according to the front-rear, left-right, and up-down directions shown in FIG. 1. Hereinafter, description will be given using the front-rear, left-right, and up-down directions defined in this manner.

The case member 30 has an upper case portion 31 and a lower case portion 32. The upper case portion 31 has a level difference, and the dimension in the up-down direction is larger at the front end portion than at the other portions. The upper case portion 31 has a flat plate portion 311 that is flat at the front end portion, and the flat plate portion 311 covers a plurality of later-described fuse terminals (not shown). Note that the electrical connection apparatus 100 (electrical connection box 1) is provided with a plurality of connector terminals 60 on the left and right side surfaces.

Figure 2:
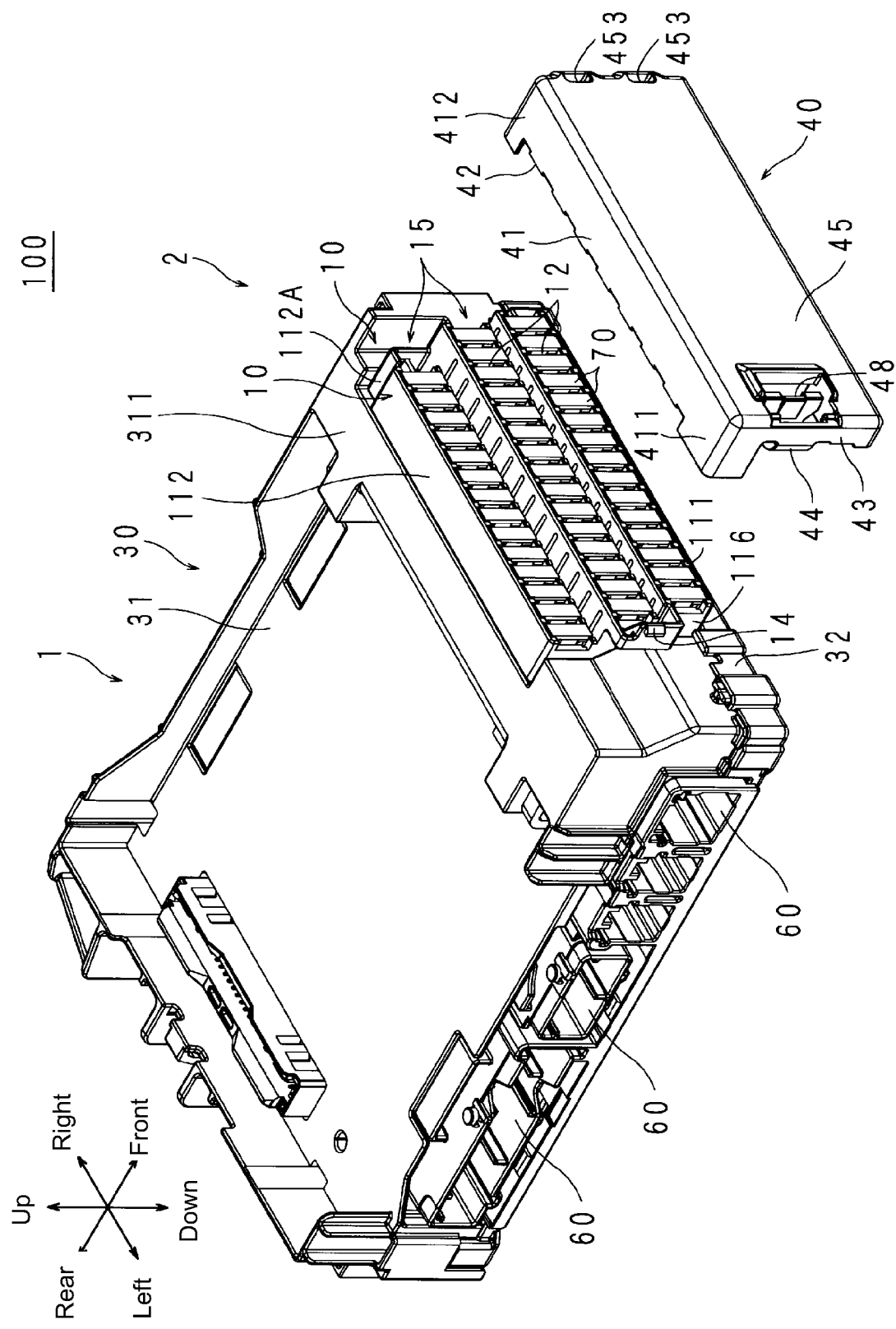
FIG. 2 is a perspective view showing a state in which a lid member has been removed in the electrical connection apparatus according to the present embodiment.
Figure 3:
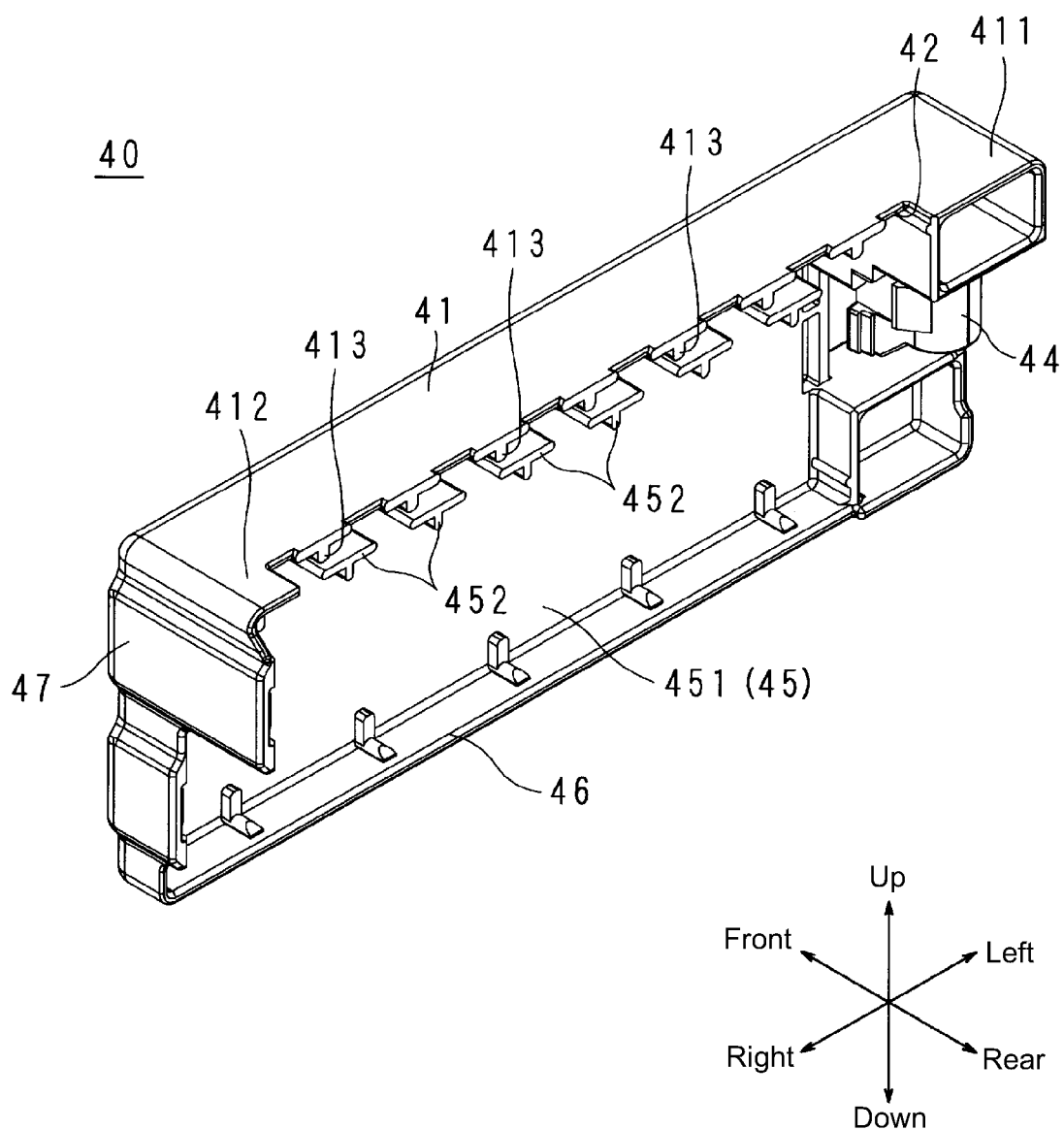
FIG. 3 is a perspective view of the lid member of the electrical connection apparatus according to the present embodiment.

FIG. 2 is a perspective view showing a state in which the lid member 40 has been removed in the electrical connection apparatus 100 according to the present embodiment, and FIG. 3 is a perspective view of the lid member 40 of the electrical connection apparatus 100 according to the present embodiment.

The fuse module 2 has an insertion housing 10 into which a plurality of fuses 70 are inserted, and a plurality of fuse terminals for connecting the fuses 70 inserted in the insertion housing 10 and the substrate. The insertion housing 10 is provided with a plurality of insertion ports 12 for inserting the fuses 70. The substrate is attached to the lower case portion 32.

The insertion housing 10 is provided on the front edge portion of the substrate, and has a plurality of (e.g., three) rows 15 (hereinafter referred to as insertion port rows 15) of the insertion ports 12 of the fuses 70 arranged side by side in a row along the left-right direction. The three insertion port rows 15 are arranged on the substrate in the up-down direction and form a stepped shape overall. That is, the insertion port rows 15 are arranged more toward the center of the substrate the farther from the substrate they are, and the side of the insertion housing 10 where the insertion ports 12 are open (hereinafter referred to as the insertion side) has a stepped shape. In other words, the insertion port rows 15 are provided more toward the rear the farther from the substrate they are.

Each insertion port 12 is rectangular, and in each insertion port row 15, a plurality of insertion ports 12 are arranged side by side in the left-right direction so that the longitudinal direction of each insertion port 12 is in the up-down direction. That is, the arrangement direction of the plurality of insertion ports 12 and the longitudinal direction of each insertion port 12 are orthogonal to each other.

The insertion housing 10 has a strip-shaped upper wall 112 located on the upper side, a lower wall 111 that faces the upper wall 112 and is located on the lower side, and a left side wall 116 and a right side wall (not shown) that are adjacent to the lower wall 111 and the upper wall 112.

The substrate is arranged on the lower side of the insertion housing 10. Specifically, the substrate is provided in the vicinity of the lower wall 111 of the insertion housing 10.

The substrate is arranged on the lower case portion 32 parallel to the lower wall 111, separated from the outer surface of the lower wall 111. Each fuse 70 inserted into the insertion ports 12 is connected to the substrate by a fuse terminal.

Also, an engaged portion 112A used when attaching the lid member 40 to the insertion housing 10 extends at the right end of the upper wall 112. Specifically, the engaged portion 112A is provided near the right end of the upper wall 112, and is a flat portion that is parallel to the upper wall 112. The engaged portion 112A extends in the longitudinal direction of the upper wall 112 with a predetermined level difference downward from the right end of the upper wall 112. In other words, the dimension in the up-down direction of the insertion housing 10 decreases at the engaged portion 112A. The amount by which the dimension decreases corresponds to the sum of the thickness of an upper long-side wall 41 on the upper side of the later-described lid member 40 and the height of a rib 413A.

The left side wall 116 is provided with a hooking protrusion 14 on the side edge portion on the front side (insertion side). The hooking protrusion 14 protrudes from the outer surface of the left side wall 116 at the central portion in the up-down direction of the left side wall 116. When the lid member 40 is attached to the insertion housing 10, a hooking claw 44 of the lid member 40, which will be described later, hooks onto the hooking protrusion 14.

The lid member 40 has a rectangular parallelepiped box shape with one face open. The front portion of the insertion housing 10 is fitted inside the lid member 40.

Figure 4:
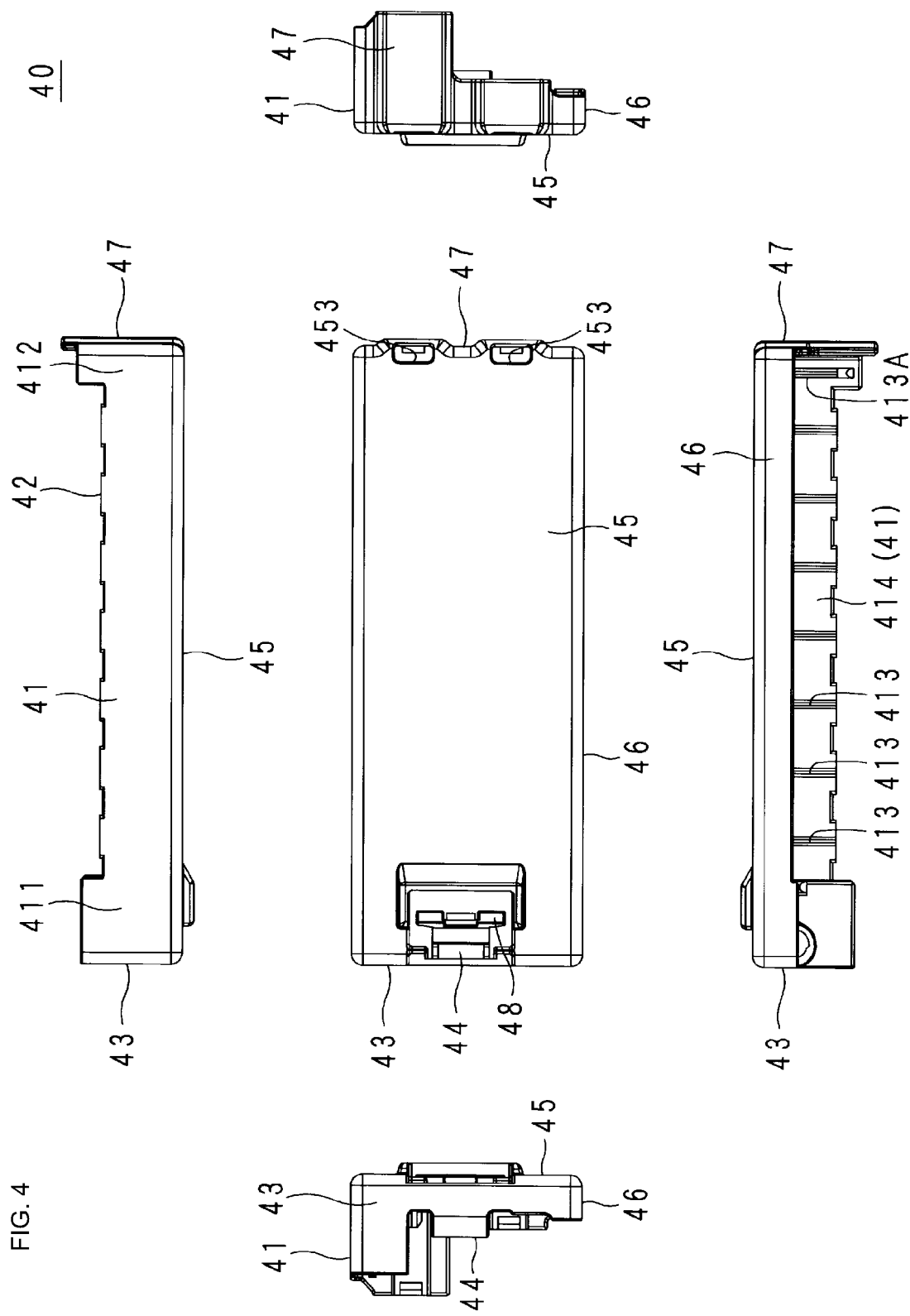
FIG. 4 is a front view, a plan view, a bottom view, a left side view, and a right side view of the lid member of the electrical connection apparatus according to the present embodiment.
Figure 5:
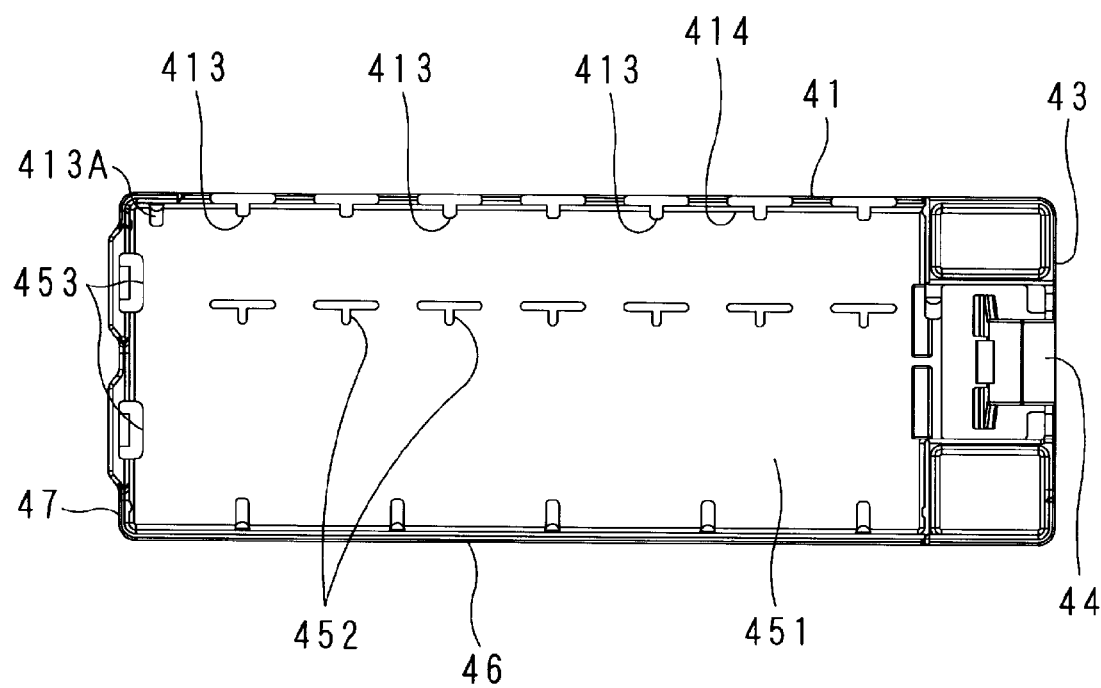
FIG. 5 is a rear view of the lid member of the electrical connection apparatus according to the present embodiment.

FIG. 4 is a front view, a plan view, a bottom view, a left side view, and a right side view of the lid member 40 of the electrical connection apparatus 100 according to the present embodiment, and FIG. 5 is a rear view of the lid member 40 of the electrical connection apparatus 100 according to the present embodiment. Of the five diagrams shown in FIG. 4, the diagram in the middle is the front view, and with respect to the front view, the upper side of the drawing is the plan view, the lower side of the drawing is the bottom view, the left side of the drawing is the left side view, and the right side of the drawing is the right side view.

The lid member 40 has an opposing wall 45 that opposes the insertion side (insertion ports 12) of the insertion housing 10 when the lid member 40 is attached to the insertion housing 10. The opposing wall 45 has a rectangular shape with the left-right direction as the longitudinal direction, and has a flat plate shape. The upper long-side wall 41 (one side wall) and the lower long-side wall 46 respectively extend from the edges on both long sides of the opposing wall 45 so as to be orthogonal to the opposing wall 45. That is, when the lid member 40 is attached to the insertion housing 10, the upper long-side wall 41 and the lower long-side wall 46 extend toward the insertion housing 10. When the lid member 40 is attached to the insertion housing 10, the upper long-side wall 41 is provided on the upper side of the opposing wall 45, and the lower long-side wall 46 is provided on the lower side of the opposing wall 45.

Also, the left short-side wall 43 and the right short-side wall 47 respectively extend from the edges on both short sides of the opposing wall 45 so as to be orthogonal to the opposing wall 45. That is, when the lid member 40 is attached to the insertion housing 10, the left short-side wall 43 and the right short-side wall 47 extend toward the insertion housing 10. The left short-side wall 43 is provided on the left side of the opposing wall 45, and the right short-side wall 47 is provided on the right side of the opposing wall 45.

In the lid member 40 according to the present embodiment, since the opposing wall 45 has a flat plate shape as described above, laser-machining of the outer surface of the lid member 40 is easy, molding is easy, and problems such as a passenger's clothes catching on the lid member 40 do not occur when the electrical connection apparatus 100 is attached to the vehicle.

The upper long-side wall 41 and the lower long-side wall 46 are both strip-shaped, but have different dimensions in the width direction, that is, in the extension direction thereof. The upper long-side wall 41 has a larger dimension in the width direction than the lower long-side wall 46. That is, the leading end of the upper long-side wall 41 protrudes from the leading end of the lower long-side wall 46 with respect to the opposing wall 45. As described above, the dimension in the width direction of the upper long-side wall 41 is larger than that of the lower long-side wall 46, in correspondence with the fact that the insertion port rows 15 are arranged more toward the rear the farther upward they are located from the substrate.

The upper long-side wall 41 is provided with ribs 413 extending in the width direction of the upper long-side wall 41 on an inner surface 414. That is, when the lid member 40 is attached to the insertion housing 10, the ribs 413 extend toward the insertion housing 10. Accordingly, it is possible to prevent the upper long-side wall 41 from bending due to the dimension in the width direction being long.

The inner surface of the opposing wall 45, that is, the opposing surface 451 that opposes the insertion ports 12 of the insertion housing 10 when the lid member 40 is attached to the insertion housing 10, is provided with spacers 452 to hold the interval between the opposing wall 45 and the insertion port 12.

As described above, each insertion port row 15 is located gradually further toward the rear the more toward the upper side it is located from the substrate. Accordingly, the distance between each insertion port row 15 and the opposing wall 45 increases the more toward the upper side the insertion port row 15 is located from the substrate. The spacers 452 are provided at a position corresponding to the uppermost insertion port row 15 at which this interval is the widest.

The spacers 452 have a T shape in a vertical cross section, and protrude in a direction orthogonal to the opposing wall 45. Also, there are a plurality of the spacers 452, and the spacers 452 are provided side by side at equal intervals in the longitudinal direction (left-right direction) of the opposing wall 45.

When the lid member 40 is attached to the insertion housing 10, the protruding end of each spacer 452 comes into contact with the insertion port row 15 (insertion ports 12). Accordingly, even though the opposing wall 45 has a flat shape that is different from the stepped shape on the insertion side of the insertion housing 10, the lid member 40 can appropriately cover the insertion ports 12.

In the opposing wall 45, two drainage ports 453 are formed vertically at the edge portion near the right short-side wall 47. The drainage ports 453 are holes that extend through the opposing wall 45 in the thickness direction, and if the electrical connection apparatus 100 is arranged in an inverted state, when liquid has accumulated in the lid member 40, the liquid is discharged through the drainage ports 453. Also, as described above, the spacers 452 are provided at intervals. Accordingly, the spacers 452 do not impede the flow of the liquid toward the drainage ports 453, and the liquid can be drained quickly.

The lid member 40 according to the present embodiment is not limited to this. A plurality of the spacers 452 may be provided in a linked manner without any interval between the spacers 452.

In the lid member 40, notches are respectively formed in the upper long-side wall 41, the left short-side wall 43, and the right short-side wall 47.

A notch 42 formed in the upper long-side wall 41 of the lid member 40 has an elongated rectangular shape, and when the lid member 40 is attached to the insertion housing 10, the upper wall 112 and the notch 42 of the insertion housing 10 are engaged with each other. That is, the upper wall 112 for the uppermost insertion port row 15 having the widest interval from the opposing wall 45 is configured to engage with the notch 42 of the upper long-side wall 41 of the lid member 40.

Specifically, the dimension in the longitudinal direction (left-right direction) of the notch 42 of the upper long-side wall 41 is equal to the dimension in the longitudinal direction of the upper wall 112 of the insertion housing 10. Accordingly, when the lid member 40 is attached to the insertion housing 10, the front end portion of the upper wall 112 engages with the notch 42. At this time, the left end and the right end of the upper wall 112 come into contact with both edges in the longitudinal direction of the notch 42.

By forming the notch 42 in the upper long-side wall 41 in this way, when the lid member 40 is attached to the insertion housing 10, the front end portion of the upper wall 112 engages with the notch 42, and therefore the dimension in the front-rear direction of the electrical connection apparatus 100 according to the present embodiment can be shortened, and thus the electrical connection apparatus 100 can be made compact.

Furthermore, when the lid member 40 is attached to the insertion housing 10, the end portion 412 on the right side out of the two end portions 411 and 412 sandwiching the notch 42 in the upper long-side wall 41 of the lid member 40 engages with the engaged portion 112A of the insertion housing 10. That is, when the lid member 40 is attached to the insertion housing 10, the left end and the right end of the upper wall 112 come into contact with the right edge of the end portion 411 and the left edge of the end portion 412 of the upper long-side wall 41, respectively. Also, as described above, a rib 413A is formed on the inner surface of the end portion 412, and the end portion 412 comes into contact with the outer surface of the engaged portion 112A via the rib 413A.

As described above, the engaged portion 112A is provided continuously from the right end of the upper wall 112, with a predetermined level difference, and the size of the level difference in the up-down direction is equal to the sum of the thickness of the end portion 412 of the lid member 40 and the height (dimension in the up-down direction) of the rib 413A. Accordingly, when the lid member 40 is attached to the insertion housing 10, the outer surfaces of the end portions 411 and 412 are flush with the outer surface of the upper wall 112.

As described above, in the electrical connection apparatus 100 according to the present embodiment, the notch 42 is formed in the upper long-side wall 41 of the lid member 40, and when the lid member 40 is attached to the insertion housing 10, the notch 42 engages the upper wall 112 of the insertion housing 10. At this time, the portion of the upper long-side wall 41 other than the notch 42 is flush with the upper wall 112 and does not overlap with the upper wall 112 in the up-down direction. Also, when the lid member 40 is attached to the insertion housing 10, the front portion of the upper wall 112 is located in the notch 42 of the upper long-side wall 41. Accordingly, in the up-down direction, the dimensions of the electrical connection apparatus 100 and the lid member 40 (opposing wall 45) can be reduced to achieve compactness.

Also, a notch that is approximately strip-shaped is formed at the lower end portion of the left short-side wall 43 of the lid member 40. In the left short-side wall 43, the hooking claw 44 is provided at the central portion in the longitudinal direction (up-down direction) of the notch, which is an edge portion of the notch. The hooking claw 44 has a hook shape, and protrudes from the edge of the left short-side wall 43 in a direction orthogonal to the opposing wall 45. When the lid member 40 is attached to the insertion housing 10, the hooking claw 44 hooks on the hooking protrusion 14 of the insertion housing 10.

Furthermore, the lid member 40 is provided with a release knob 48 used for operating the hook claw 44 when unhooking the hooking claw 44 and the hooking protrusion 14.

The embodiments disclosed this time are to be considered as exemplary in all respects and not restrictive. The scope of the present invention is indicated not by the above-described meaning but by the claims, and modifications within the meaning and scope of equivalency to the claims are intended to be encompassed therein.

The invention claimed is:

1. An electrical connection box cover for covering a plurality of insertion ports for fuses of an electrical connection box including an insertion housing in which a plurality of rows of the plurality of insertion ports arranged side by side in one direction are provided in a stepped shape, the electrical connection box cover comprising:
   a flat opposing wall configured to oppose the insertion ports when the electrical connection box cover is attached to the electrical connection box;
   a plurality of spacers that are provided in a protruding manner on a surface of the opposing wall that opposes the insertion ports, a leading end of at least one of the plurality of spacers being configured to come into contact with the insertion housing when the electrical connection box cover is attached to the electrical connection box, and the plurality of spacers are arranged side by side at a predetermined interval; and
   a drainage port that is formed in the opposing wall and is configured to discharge a liquid flowing between the plurality of spacers.

2. The electrical connection box cover according to claim 1,
   wherein the opposing wall is rectangular,
   long-side walls that extend in a direction intersecting the opposing wall are respectively extending on both long-side edges of the opposing wall, and
   a rib that extends along an extension direction is provided on an inner surface of one of the two long-side walls with a longer dimension in the extension direction.

3. The electrical connection box cover according to claim 2,
   wherein a notch configured to engage with one side wall of the insertion housing is formed in the one long-side wall, and
   during the engagement, the one long-side wall and the one side wall are flush with each other.

4. An electrical connection apparatus comprising:
   the electrical connection box cover according to claim 1; and
   the electrical connection box.

* * * * *